US010908466B2

(12) United States Patent
Niu et al.

(10) Patent No.: US 10,908,466 B2
(45) Date of Patent: Feb. 2, 2021

(54) BLACK MATRIX, PREPARATION METHOD THEREFOR, AND SYSTEM THEREOF, DISPLAY SUBSTRATE, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Zong Niu, Beijing (CN); Fang Yang, Beijing (CN); Shikun Cui, Beijing (CN); Zhenyang Cao, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 9 days.

(21) Appl. No.: 16/320,782

(22) PCT Filed: May 8, 2018

(86) PCT No.: PCT/CN2018/086038
§ 371 (c)(1),
(2) Date: Jan. 25, 2019

(87) PCT Pub. No.: WO2018/228091
PCT Pub. Date: Dec. 20, 2018

(65) Prior Publication Data
US 2020/0183236 A1    Jun. 11, 2020

(30) Foreign Application Priority Data
Jun. 12, 2017    (CN) .......................... 2017 1 0439960

(51) Int. Cl.
*G02F 1/1362*    (2006.01)
*G02F 1/13*    (2006.01)

(52) U.S. Cl.
CPC ...... *G02F 1/136209* (2013.01); *G02F 1/1303* (2013.01)

(58) Field of Classification Search
CPC ............ G02F 1/136209; G02F 1/1303; G02F 1/133512; G03F 7/0007; G03F 7/203
See application file for complete search history.

(56) References Cited

U.S. PATENT DOCUMENTS

2003/0138742 A1* 7/2003 Irie .................... G03F 7/201
430/396
2004/0223095 A1    11/2004 Tsubata et al.
(Continued)

FOREIGN PATENT DOCUMENTS

CN    1550841 A    12/2004
CN    101493649 A    7/2006
(Continued)

OTHER PUBLICATIONS

International Search Report and Written Opinion dated Jul. 28, 2018; PCT/CN2018/086038.

*Primary Examiner* — Yasser A Abdelaziez

(57) ABSTRACT

A black matrix, a preparation method therefor, and a system thereof, a display substrate, and a display device are provided. The preparation method includes: forming a black matrix thin film on a substrate; on one side, away from the substrate, of the black matrix thin film, carrying out first exposure processing on the black matrix thin film; on one side, close to the substrate, of the black matrix thin film, carrying out second exposure processing on the black matrix (Continued)

thin film; and developing the black matrix thin film after the first exposure processing and the second exposure processing to form the black matrix.

8 Claims, 2 Drawing Sheets

(56) References Cited

U.S. PATENT DOCUMENTS

| | | | |
|---|---|---|---|
| 2009/0185059 A1* | 7/2009 | Kim | G03F 7/033 348/273 |
| 2014/0125931 A1* | 5/2014 | Niu | G02F 1/133514 349/106 |
| 2015/0248051 A1* | 9/2015 | Yang | G02B 5/201 430/7 |
| 2017/0269424 A1 | 9/2017 | Long et al. | |
| 2018/0052395 A1* | 2/2018 | Li | G03F 7/0007 |

FOREIGN PATENT DOCUMENTS

| | | |
|---|---|---|
| CN | 101493649 A | 7/2009 |
| CN | 104267518 A | 1/2015 |
| CN | 105116685 A | 12/2015 |
| CN | 107065292 A | 8/2017 |

\* cited by examiner

BLACK MATRIX, PREPARATION METHOD THEREFOR, AND SYSTEM THEREOF, DISPLAY SUBSTRATE, AND DISPLAY DEVICE

The present application claims priority of China Patent application No. 201710439960.1 filed on Jun. 12, 2017, the content of which is incorporated in its entirety as portion of the present application by reference herein.

TECHNICAL FIELD

Embodiments of the present disclosure relate to a black matrix, a preparation method thereof, a system for preparing a black matrix, a display substrate, and a display device.

BACKGROUND

Liquid crystal display (LCD) devices have become mainstream products in flat panel display devices due to their small volume, low power consumption, and no radiation. With the continuous development of the display industry, liquid crystal display devices with high PPI (Pixel Per Inch) (such as two-dimensional display devices and VR display devices) are more and more popular, thus, the display techniques of liquid crystal display devices with high PPI have been widely studied and applied, and will also become an important development direction of display technology. In order to adapt to the display requirements of the liquid crystal display devices with high PPI and improve the detail richness of the images and the photo-realistic of the liquid crystal display devices, higher requirements on the preparation process of a liquid crystal display device, especially the preparation process of a black matrix which is a key component that affects the display effect, have been put forward.

SUMMARY

Some embodiments of the present disclosure provide a preparation method of a black matrix, the preparation method includes: forming a black matrix thin film on a substrate; performing a first exposure process on a side of the black matrix thin film away from the substrate; performing a second exposure process on a side of the black matrix thin film close to the substrate; and performing a development process on the black matrix thin film subjected to the first exposure process and the second exposure process to form the black matrix. Thus, an upper surface and a lower surface of the prepared black matrix have small area difference, an adhesive force between the prepared black matrix and the substrate is increased, and the prepared black matrix is hard to be peeled off. In this way, the black matrix is favorable to obtain a display effect having a high pixel density, a high photo-realistic, and high detail richness of images, and the product yield can be further improved.

In some examples, a material of the black matrix thin film is negative photoresist.

In some examples, the substrate is supported by an air flotation device during the second exposure process. The air flotation device is used to support the substrate, so that the second exposure process is not affected.

In some examples, the first exposure process is performed by using a first mask plate, and the first mask plate is provided with a first light transmitting pattern; the second exposure process is performed by using a second mask plate, and the second mask plate is provided with a second light transmitting pattern; and an orthographic projection of the second light transmitting pattern on the substrate upon performing the second exposure process is located within an orthographic projection of the first light transmitting pattern on the substrate upon performing the first exposure process. Thus, requirements for the alignment accuracy of the mask plates can be reduced.

Some embodiments of the present disclosure provide a system for preparing a black matrix, the system includes a first exposure device, configured to perform a first exposure process on a black matrix thin film on a substrate from a side of the black matrix thin film away from the substrate; a second exposure device, configured to perform a second exposure process on the black matrix thin film from a side of the black matrix thin film close to the substrate; and a development device, configured to perform a development process on the black matrix thin film subjected to the first exposure process and the second exposure process to form the black matrix.

In some examples, the second exposure device includes an air flotation device, configured to support the substrate during the second exposure process.

In some examples, the first exposure device includes a first mask plate, and the first mask plate is provided with a first light transmitting pattern; the second exposure device includes a second mask plate, and the second mask plate is provided with a second light transmitting pattern; and an orthographic projection of the second light transmitting pattern on the substrate upon performing the second exposure process is located within an orthographic projection of the first light transmitting pattern on the substrate upon performing the first exposure process.

Some embodiments of the present disclosure provide a black matrix, wherein the black matrix is prepared by the abovementioned preparation method.

In some examples, an area of a surface of the black matrix close to the substrate is not less than 50% of an area of a surface of the black matrix away from the substrate.

Some embodiments of the present disclosure provide a display substrate, the display substrate includes the abovementioned black matrix.

Some embodiments of the present disclosure provide a display device, the display device includes the abovementioned display substrate.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The inventor(s) has found that, current liquid crystal display devices generally have problems such as low pixel density and low product yield. The inventor(s) has conducted an intensive research and a large number of experiments and found that, these problems are mainly due to a fact that the black matrix of the display device is difficult to truly achieve a narrow line width. The black matrix in a liquid crystal display device is a key component that affects the display effect of the display device, and the preparation process of the black matrix directly affects the display effect of the liquid crystal display device. For example, a display device is provided with a black matrix (BM) for avoiding light leakage, so as to block a region where the liquid crystal molecules are not controlled by the array substrate. Because the black matrix cannot be used for display, upon a black matrix being prepared, in order to obtain a higher pixel density, the black matrix is required to have a finer line width; however, a finer line width tends to cause the black matrix to be easily peeled off in a subsequent preparation process, resulting in a poor product yield. In this way, the preparation of a liquid crystal display device with high pixel density is largely limited. Therefore, while increasing the pixel density, it is ensured that the prepared black matrix is not easily peeled off, the display effect of the liquid crystal display device can be greatly improved, and the detail richness of images and the photo-realistic of the display device can be improved.

Figure 1:
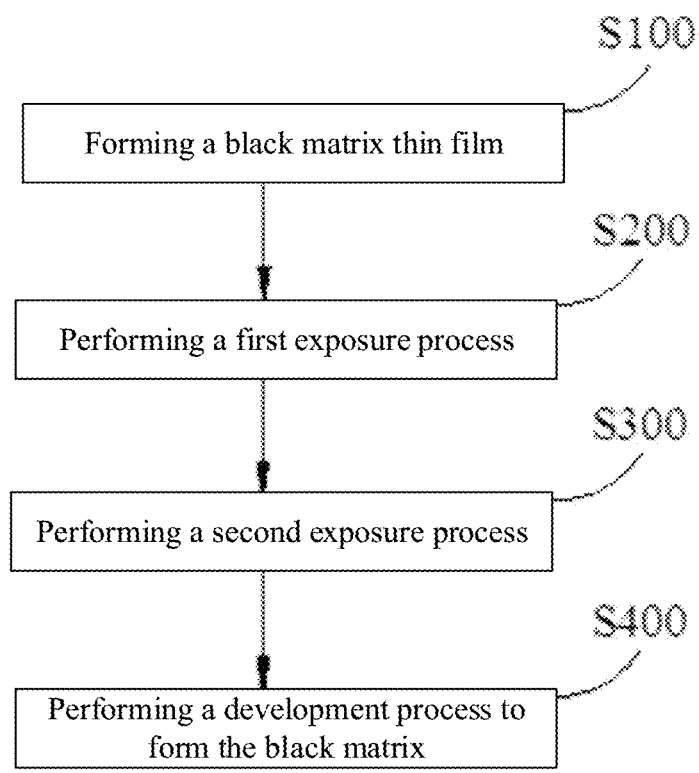
FIG. 1 shows a flowchart of a preparation method of a black matrix provided by an embodiment of the present disclosure.

Some embodiments of the present disclosure provide a preparation method of a black matrix. According to an embodiment of the present disclosure, referring to FIG. 1, the preparation method includes the following steps S100-S400.

S100: forming a black matrix thin film.

In this step, the black matrix thin film is formed on the substrate. According to an embodiment of the present disclosure, the specific material of the substrate is not particularly limited, as long as the substrate can satisfy the support of the black matrix thin film, and can allow light to pass through to perform an exposure process on a bottom of the black matrix thin film (a side of the black matrix thin film close to the substrate) upon performing a second exposure process on the side of the black matrix thin film close to the substrate in a subsequent step. According to an embodiment of the present disclosure, the black matrix thin film may be formed by coating photoresist on the substrate. According to an embodiment of the present disclosure, the specific type of the photoresist is not particularly limited as long as the performance of the black matrix thin film can be satisfied.

S200: performing a first exposure process.

In this step, the black matrix thin film is subjected to the first exposure process from a side of the black matrix thin film away from the substrate. That is, light for exposure is incident on the black matrix thin film from the side of the black matrix thin film away from the substrate. According to an embodiment of the present disclosure, the first exposure process is performed by using a first mask plate, and the first mask plate is provided with a first light transmitting pattern.

S300: performing a second exposure process.

In this step, the black matrix thin film is subjected to the second exposure process from a side of the black matrix thin film close to the substrate. According to an embodiment of the present disclosure, the second exposure process is performed by using a second mask plate, and the second mask plate is provided with a second light transmitting pattern. For example, light for exposure is incident from a side of the substrate away from the black matrix thin film and reaches the black matrix thin film after passing through the substrate. Thus, an exposure amount of the side of the black matrix thin film close to the substrate can be increased, and a degree of polymerization of the side of the black matrix thin film close to the substrate can be increased, so that, upon reducing the line width of the black matrix, an adhesive force between the black matrix and the substrate can be increased, the black matrix is not easily peeled off, and the product yield is improved, so as to satisfy the requirements of products with high pixel density. According to an embodiment of the present disclosure, the substrate is supported by an air flotation device during the second exposure process. Thus, the substrate can be supported by the air flotation device without affecting the second exposure process.

It should be noted that, in the present disclosure, the sequence of the first exposure process and the second exposure process is not particularly limited, as long as both of the side of the black matrix thin film away from the substrate and the side of the black matrix thin film close to the substrate can be exposed. That is to say, according to an embodiment of the present disclosure, the first exposure process may be performed first, and then the second exposure process may be performed; or, the second exposure process may be performed first, and then the first exposure process may be performed. For example, the first exposure process may be firstly performed on the side of the black matrix thin film away from the substrate, and then the substrate is supported by the air flotation device, and the second exposure process is performed on the side of the black matrix thin film close to the substrate. Or, the substrate is firstly supported by the air flotation device, and the second exposure process is performed on the side of the black matrix thin film close to the substrate, and then the first exposure process is performed on the side of the black matrix thin film away from the substrate.

According to a specific embodiment of the present disclosure, in the above-described first exposure process, the first mask plate having the first light transmitting pattern is used for exposure, and in the above-described second exposure process, the second mask plate having the second light transmitting pattern is used for exposure; an orthographic projection of the second light transmitting pattern on the substrate is located within an orthographic projection of the first light transmitting pattern on the substrate, that is, an edge of the orthographic projection of the second light transmitting pattern has a distance of 1-2 micrometers from an edge of the orthographic projection of the first light transmitting pattern on the substrate, thus, requirements for alignment accuracy of the mask plates can be reduced. For example, the orthographic projection of the second light transmitting pattern on the substrate during the second exposure process is located within the orthographic projection of the first light transmitting pattern on the substrate during the first exposure process. Assuming that the orthographic projection of the second light transmitting pattern on the substrate is partially located outside the orthographic projection of the first light transmitting pattern on the substrate, the degree of polymerization of bottom photoresist is increased, so that an area of a lower surface of the black matrix is greater than that of an upper surface of the black matrix, which increases the line width of the black matrix, and does not satisfy the requirements of products with high pixel density. That is to say, a light transmitting area of the second light transmitting pattern may be smaller than that of the first light transmitting pattern. Assuming that the orthographic projection of the second light transmitting pattern on the substrate completely coincides with the orthographic projection of the first light transmitting pattern on the substrate, that is, the edge of the orthographic projection of the second light transmitting pattern on the substrate completely coincides with the edge of the orthographic projection of the first light transmitting pattern on the substrate, a higher alignment accuracy is required, that is, the second light transmitting pattern in the second mask plate needs to be accurately aligned with the first light transmitting pattern in the first mask plate. If there is an alignment error, the line width of the black matrix is increased, and the requirements of products with high pixel density cannot be satisfied. Therefore, the orthographic projection of the second light transmitting pattern on the substrate is located within the orthographic projection of the first light transmitting pattern on the substrate, that is, the edge of the orthographic projection of the second light transmitting pattern on the substrate has a distance of 1-2 micrometers from the edge of the orthographic projection of first light transmitting pattern on the substrate, which can both satisfy the requirement for finer line width and reduce the alignment accuracy of the second mask plate. Thus, the exposure effect can be further improved and the product yield can be improved.

In summary, the first exposure process and the second exposure process can be used to simply obtain a black matrix of which the side of the black matrix thin film away from the substrate and the side of the black matrix thin film close to the substrate are both exposed, and an adhesive force between the obtained black matrix and the substrate is improved, the obtained black matrix is hard to be peeled off, and the product yield is high.

S400: performing a development process to form the black matrix.

In this step, the black matrix thin film which has been subjected to the first exposure process and the second exposure process is developed to form a black matrix. According to an embodiment of the present disclosure, in the black matrix prepared by the preparation method, an area of a surface close to the substrate is not less than 50% of an area of a surface away from the substrate. Thus, an upper surface and a lower surface of the prepared black matrix have small area difference, and the prepared black matrix is hard to be peeled off. In this way, the black matrix is favorable to obtain a display effect having a high pixel density, a high photo-realistic, and high detail richness of images, and the product yield can be further improved.

In summary, while increasing the pixel density, it is ensured that the prepared black matrix is not easily peeled off, the display effect of the liquid crystal display device can be greatly improved, the inventor(s) has conducted an intensive research and a large number of experiments and found that, in the preparation process of the black matrix, the second exposure process can be added on a basis of the first exposure process (single-sided exposure) in a traditional preparation method of a black matrix, thereby achieving exposure on two sides of the black matrix thin film (the side of the black matrix thin film away from the substrate and the side of the black matrix thin film close to the substrate) to obtain the black matrix. That is to say, the black matrix is formed by photoresist after double-sided exposure. For example, first, the photoresist is coated on the substrate to form the black matrix thin film, and then the side of the black matrix thin film away from the substrate (for example, the top of the photoresist) is subjected to single-sided exposure, after the step and before the development step, the second exposure process is performed on the side of the black matrix thin film close to the substrate (for example, the bottom of the photoresist), that is, double-sided exposure is performed. The exposure process on the bottom of the black matrix thin film further improves the degree of polymerization of the bottom photoresist, and the degree of development is weakened. An adhesive force between the bottom of the black matrix formed after development and the substrate is increased, and the black matrix is not easily peeled off, so that a finer line width of the black matrix can be achieved to meet the requirements of products with high pixel density. Double-sided exposure can further increase the degree of polymerization of the bottom photoresist. Therefore, even in a case that the area of the bottom photoresist is smaller, the adhesive force between the black matrix and the substrate can be improved, so as to prevent the black matrix from being peeled off.

Figure 2:
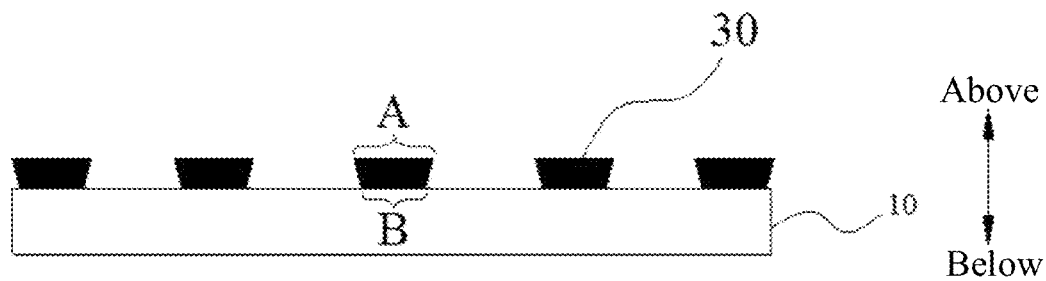
FIG. 2 shows a schematic structural diagram of a black matrix provided by an embodiment of the present disclosure.

Some embodiments of the present disclosure provide a black matrix 30. According to an embodiment of the present disclosure, the black matrix 30 is prepared by the preparation method of the black matrix described above. Thus, the black matrix 30 has all of the features and advantages of the black matrix 30 prepared by using the abovementioned preparation method. According to an embodiment of the present disclosure, referring to FIG. 2, the black matrix 30 is disposed on a substrate 10, an area of a surface of the black matrix 30 close to the substrate 10 is not less than 50% of an area of a surface of the black matrix 30 away from the substrate 10. Thus, an upper surface and a lower surface of the black matrix 30 have small area difference, and the black matrix 30 being in contact with the substrate 10 is hard to be peeled off. In this way, the black matrix 30 is favorable to obtain a display effect having a high pixel density, a high photo-realistic, and high detail richness of images, and the product yield can be further improved.

Figure 3:
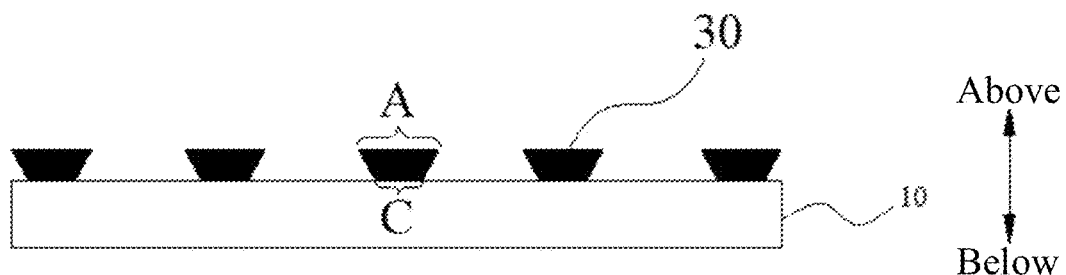
FIG. 3 shows a schematic structural diagram of a black matrix prepared by a traditional preparation method.
Figure 4:
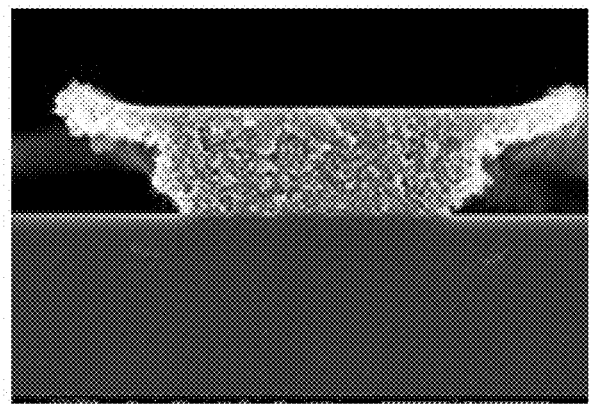
FIG. 4 shows a scanning electron micrograph of a black matrix prepared by a traditional preparation method.

In the traditional preparation method of the black matrix 30, first, photoresist is coated on the substrate 10 to form a black matrix thin film 20, and then processes such as exposure, development, and the like are performed. However, during the exposure process, because only the top of the black matrix thin film 20 is subjected to the first exposure process (single-sided exposure), the applied photoresist has a light-shielding effect, so the exposure amount gradually reduces from an upper surface of the photoresist to the bottom of the photoresist, and the degree of polymerization is also lowered, so that the degree of development of the bottom of the black matrix 30 finally formed is greater than that of the top of the black matrix 30. Referring to FIG. 3, the black matrix thin film 20 is developed to form the black matrix 30, causing the area C of a lower surface of the black matrix 30 to be much smaller than the area A of an upper surface of the black matrix 30. In a case where the line width of the black matrix 30 (i.e., a width of a cross section of the black matrix 30) is relatively large, even if the area difference of the upper surface and lower surface of the black matrix 30 is large, it can still be ensured that the lower surface has a sufficient area to be in contact with the substrate 10. However, in the black matrix 30 with a narrowed line width, the line width is required to be small, so that the area of the lower surface is significantly lower than the area of the upper surface under the preparation method, which causes an adhesive force between the bottom of the black matrix 30 and the substrate 10 to be small, and the black matrix 30 is easy to be peeled off, and the product yield is lowered. Therefore, according to the traditional preparation method, if the product yield is to be ensured, a finer line width cannot be obtained, so that the requirements of products with high pixel density cannot be satisfied. Referring to FIG. 4, a scanning electron micrograph (SEM graph) of a black matrix 30 prepared by a traditional preparation method is shown, as shown in the figure, under the single-sided exposure, the area of the lower surface of the black matrix 30 is much smaller than that of the upper surface of the black matrix 30. Therefore, an adhesive force between the bottom of the black matrix 30 and the substrate 10 is small, the black matrix is easy to be peeled off, and the product yield is lowered.

According to an embodiment of the present disclosure, the area difference between the upper surface and lower surface of the black matrix 30 is small, which is favorable to improve a bonding degree between the black matrix 30 and the substrate 10, so as to prevent the black matrix 30 from being peeled off, and improve the product yield. According to an embodiment of the present disclosure, referring to FIG. 2, the area of the surface of the black matrix 30 close to the substrate 10 is not less than 50% of the area of the surface of the black matrix 30 away from the substrate 10. The area of the surface of the black matrix 30 away from the substrate 10 is A illustrated in FIG. 2, and the area of the surface of the black matrix 30 close to the substrate 10 is B illustrated in FIG. 2. Thus, the cross section of the black matrix 30 is not significantly reduced in a direction perpendicular to the substrate 10, and the adhesive force between the black matrix 30 and the substrate 10 is improved, so that the black matrix 30 is not easily peeled off, and a finer line width can be obtained, thereby satisfying the requirements of products with high pixel density.

Some embodiments of the present disclosure provide a system for preparing the black matrix 30. According to an embodiment of the present disclosure, referring to FIG. 5a, the system includes a first exposure device 100, a second exposure device 200, and a development device 300. According to an embodiment of the present disclosure, the first exposure device 100 is configured to perform a first exposure process on the black matrix thin film 20 from a side of the black matrix thin film 20 away from the substrate 10. According to an embodiment of the present disclosure, the first exposure device 100 further includes a first mask plate 110. According to an embodiment of the present disclosure, the second exposure device 200 is configured to perform a second exposure process on the black matrix thin film 20 from a side of the black matrix thin film 20 close to the substrate 10. According to an embodiment of the present disclosure, the second exposure device 200 further includes an air flotation device 210 and a second mask plate 220. According to an embodiment of the present disclosure, the development device 300 is configured to perform a development process on the black matrix thin film 20 subjected to the first exposure process and the second exposure process to form the black matrix 30. Therefore, the black matrix 30 can be easily obtained by using the system, and an upper surface and a lower surface of the prepared black matrix 30 have small area difference, the adhesive force between the black matrix 30 and the substrate 10 is strong, and the black matrix 30 is hard to be peeled off. In this way, the black matrix 30 is favorable to obtain a display effect having a high pixel density, a high photo-realistic, and high detail richness of images, and the product yield can be further improved.

According to the embodiment of the present disclosure, the sequence in which exposure processes are performed by the first exposure device 100 and the second exposure device 200 is not particularly limited, as long as the exposure processes on the side of the black matrix thin film 20 close to the substrate 10 and the side of the black matrix thin film 20 away from the substrate 10 can be accomplished by the first exposure device 100 and the second exposure device 200. That is to say, the first exposure device 100 can be firstly used to perform the exposure process on the side of the black matrix thin film 20 away from the substrate 10, and then the second exposure device 200 can be used to perform the exposure process on the side of the black matrix thin film 20 close to the substrate 10. Or, the second exposure device 200 can be firstly used to perform the exposure process on the side of the black matrix thin film 20 close to the substrate 10, and then the first exposure device 100 can be used to perform the exposure process on the side of the black matrix thin film 20 away from the substrate 10. That is to say, the system can firstly perform the exposure process on the side of the black matrix thin film 20 away from the substrate 10, or can firstly perform the exposure process on the side of the black matrix thin film 20 close to the substrate 10.

According to an embodiment of the present disclosure, an air flotation device 210 is configured to support the substrate 10 upon the second exposure device 200 performing a second exposure process on the side of the black matrix thin film 20 close to the substrate 10. Thus, upon the black matrix thin film 20 being subjected to the exposure process from the side of the black matrix thin film 20 close to the substrate 10, the substrate 10 can be supported without affecting the second exposure process. According to an embodiment of the present disclosure, referring to FIG. 5a, the first exposure device 100 may be firstly used to perform the first exposure process on the black matrix thin film 20 from the side of the black matrix thin film 20 away from the substrate 10, and then the air flotation device 210 can be used to support the substrate, and the second exposure device 200 is used to perform the second exposure process on the black matrix thin film 20 from the side of the black matrix thin film 20 close to the substrate 10. The air flotation device 210 does not block a light source of the second exposure process from illuminating the black matrix thin film 20 from the side of the black matrix thin film 20 away from the substrate 10. In summary, according to an embodiment of the present disclosure, the sequence of the first exposure process and the second exposure process is not particularly limited, that is, the side of the black matrix thin film 20 away from the substrate 10 and the side of the black matrix thin film 20 close to the substrate 10 are respectively subjected to one exposure process (double-sided exposure).

Figure 5A:
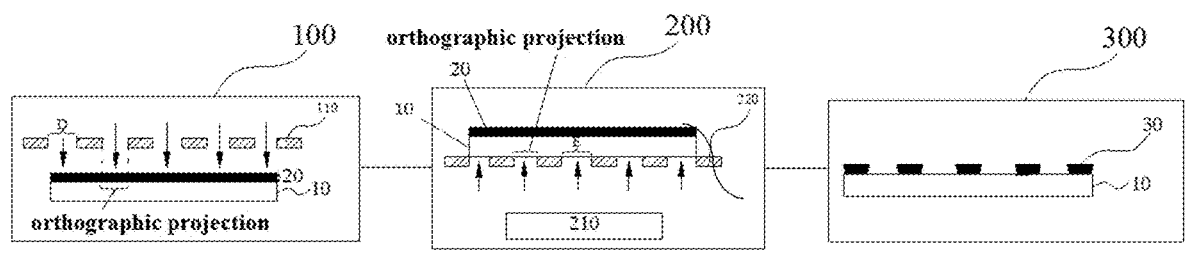
FIG. 5a shows a schematic structural diagram of a system for preparing a black matrix provided by an embodiment of the present disclosure.

According to an embodiment of the present disclosure, an orthographic projection of the second light transmitting pattern (E as shown in FIG. 5a) on the substrate 10 is located within an orthographic projection of the first light transmitting pattern (D as shown in FIG. 5a) on the substrate 10. That is, an edge of the orthographic projection of the second light transmitting pattern on the substrate 10 has a distance of 1-2 micrometers from an edge of the orthographic projection of the first light transmitting pattern on the substrate 10, therefore, the orthographic projection of the second light transmitting pattern on the substrate 10 is located within the orthographic projection of the first light transmitting pattern on the substrate 10, so as to reduce the need for alignment accuracy of the mask plates. It should be understood by those skilled in the art that the second exposure device 200 is used for increasing the exposure amount of a backside of the substrate 10, so as to improve a contact area of the black matrix 30 and substrate 10, and increase an adhesive force between the black matrix 30 and the substrate 10. Therefore, the orthographic projection of the second light transmitting pattern on the substrate 10 is located within the orthographic projection of the first light transmitting pattern on the substrate 10, which can reduce the alignment accuracy of the second mask plate 220. Assuming that the orthographic projection of the second light transmitting pattern on the substrate 10 is partially located outside the orthographic projection of the first light transmitting pattern on the substrate 10, the degree of polymerization of bottom photoresist is increased, so that an area of a lower surface of the black matrix is greater than that of an upper surface of the black matrix, which increases the line width of the black matrix, and does not satisfy the requirements of products with high pixel density. Assuming that the orthographic projection of the second light transmitting pattern on the substrate 10 completely coincides with the orthographic projection of the first light transmitting pattern on the substrate 10, that is, the edge of the orthographic projection of the second light transmitting pattern on the substrate 10 completely coincides with the edge of the orthographic projection of the first light transmitting pattern on the substrate 10, a higher alignment accuracy is required, that is, the second light transmitting pattern in the second mask plate 220 needs to be accurately aligned with the first light transmitting pattern in the first mask plate 110. If there is an alignment error, the line width of the black matrix is increased, and the requirements of products with high pixel density cannot be satisfied. Therefore, the orthographic projection of the second light transmitting pattern on the substrate 10 is located within the orthographic projection of the first light transmitting pattern on the substrate 10, that is, the edge of the orthographic projection of the second light transmitting pattern on the substrate 10 has a distance of 1-2 micrometers from the edge of the orthographic projection of first second light transmitting pattern on the substrate 10, which can both satisfy the requirement for finer line width and reduce the alignment accuracy of the second mask plate 220. Thus, a double exposure effect of the system can be further improved and the product yield can be improved.

According to an embodiment of the present disclosure, the specific type of exposure performed by the first exposure device 100 and the second exposure device 200 is not particularly limited, and only needs to satisfy the preparation requirements of the black matrix 30, for example, the specific type of exposure may be ultraviolet exposure.

Figure 6:
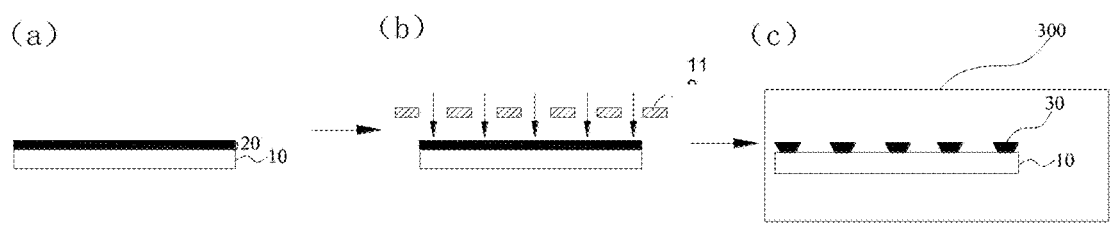
FIG. 6 shows a flowchart of a traditional preparation method of a black matrix.

In general, in the traditional system for preparing the black matrix 30, referring to (a)-(c) of FIG. 6, a black matrix thin film 20 is firstly formed on the substrate 10. Then, a first mask plate 110 is used to perform an exposure process on the black matrix thin film 20 from a side of the black matrix thin film 20 away from the substrate 10, that is, a top of the black matrix thin film 20 is subjected to a single-sided exposure process. Finally, the black matrix thin film 20 subjected to the single-sided exposure is developed to form a black matrix 30. The adhesive force between a bottom of the black matrix 30 which is subjected to the single-sided exposure and the substrate 10 is small, the black matrix 30 is easy to be peeled off, the product yield is lowered, and a finer line width cannot be obtained, thereby failing to satisfy the requirements of products with high pixel density.

According to an embodiment of the present disclosure, referring to FIG. 5a, the system for preparing the black matrix 30 firstly forms a black matrix thin film 20 on the substrate 10. Then, a first mask plate 110 is used to perform a first exposure process on the black matrix thin film 20 from a side of the black matrix thin film 20 away from the substrate 10, that is, the top of the black matrix thin film 20 is subjected to the first exposure process (a single-sided exposure process). Then, an air flotation device 210 is used to support the substrate 10, and the black matrix thin film 20 is subjected to a second exposure process, a second mask plate 220 is used to perform the second exposure process on the black matrix thin film 20 from a side of the black matrix thin film 20 close to the base 10, i.e., the bottom of the black matrix thin film 20 is subjected to the second exposure process (backside exposure). Finally, a development device 300 is used to perform a development process on the black matrix thin film 20 which is subjected to the first exposure process and the second exposure process, to form a black matrix 30. Thus, the black matrix thin film 20 can be easily subjected to double-sided exposure, and the adhesive force between the black matrix 30 and the substrate 10 can be increased, and the degree of development can be weakened, thereby obtaining a finer line width and satisfying the requirements for high pixel density.

In summary, the black matrix 30 prepared by the above-described preparation method has high product yield and satisfies the requirements for a thinner line width, which is favorable to obtain the display effect with high pixel density, high photo-realistic, and richer detail of images.

At least one embodiment of the present disclosure provides a display substrate including a black matrix. According to an embodiment of the present disclosure, the black matrix is prepared by using the above-described preparation method. Therefore, the display substrate has all the features and advantages of the black matrix described above, and the repeated portions are omitted herein.

Figure 5B:
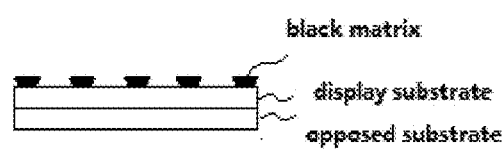
FIG. 5b shows a schematic structural diagram of a display device provided by an embodiment of the present disclosure.

At least one embodiment of the present disclosure provides a display device including a black matrix. As illustrated in FIG. 5b, the display device includes the above-described display substrate. According to an embodiment of the present disclosure, the black matrix is prepared by using the above-described preparation method. Thus, the display device has all of the features and advantages of the black matrix described above, and the repeated portions are omitted herein.

In the description of the present disclosure, the orientation or positional relationship of the terms "upper", "lower" and the like is based on the orientation or positional relationship shown in the drawings, and is merely used for the convenience of describing the present disclosure and does not require that the present disclosure must be constructed or operated in the specific orientation, and thus cannot be construed to limit the present disclosure.

In the description of the present specification, the description of the terms "one embodiment", "another embodiment" or the like means that the specific features, structures, materials or characteristics described in connection with the embodiments are included in at least one embodiment of the present disclosure. In the present description, the schematic representation of the abovementioned terms is not necessarily directed to the same embodiment or example. Furthermore, the particular features, structures, materials, or characteristics described may be combined in a suitable manner in any one or more embodiments or examples. In addition, various embodiments or examples described in the specification, as well as features of various embodiments or examples, may be combined. In addition, it should be noted that in the present description, the terms "first" and "second" are used for descriptive purposes only, and are not to be understood as indicating or implying relative importance or implicitly indicating the number of indicated technical features.

The foregoing is only exemplary embodiments of the present disclosure, but the scope of protection of the present disclosure is not limited thereto, and the scope of protection of the present disclosure is subject to the scope of protection of the claims.

What is claimed is:

1. A preparation method of a black matrix, comprising:
   forming a black matrix thin film on a substrate;
   performing a first exposure process on a side of the black matrix thin film away from the substrate by using a first mask plate;
   performing a second exposure process on a side of the black matrix thin film close to the substrate by using a second mask plate; and
   performing a development process on the black matrix thin film subjected to the first exposure process and the second exposure process to form the black matrix, wherein
   the first mask plate is provided with a first light transmitting pattern;
   the second mask plate is provided with a second light transmitting pattern; and
   an orthographic projection of the second light transmitting pattern on the substrate upon performing the second exposure process is located within an orthographic projection of the first light transmitting pattern on the substrate upon performing the first exposure process, and an edge of the orthographic projection of the second light transmitting pattern has a distance of 1-2 micrometers from an edge of the orthographic projection of the first light transmitting pattern.

2. The preparation method according to claim 1, wherein a material of the black matrix thin film is negative photoresist.

3. The preparation method according to claim 1, wherein the substrate is supported by an air flotation device during the second exposure process.

4. A system for preparing a black matrix, comprising:
   a first exposure device, configured to perform a first exposure process on a black matrix thin film on a substrate from a side of the black matrix thin film away from the substrate;
   a second exposure device, configured to perform a second exposure process on the black matrix thin film from a side of the black matrix thin film close to the substrate; and
   a development device, configured to perform a development process on the black matrix thin film subjected to the first exposure process and the second exposure process to form the black matrix, wherein
   the first exposure device comprises a first mask plate, and the first mask plate is provided with a first light transmitting pattern;
   the second exposure device comprises a second mask plate, and the second mask plate is provided with a second light transmitting pattern; and
   an orthographic projection of the second light transmitting pattern on the substrate upon performing the second exposure process is located within an orthographic projection of the first light transmitting pattern on the substrate upon performing the first exposure process, and an edge of the orthographic protection of the second light transmitting pattern has a distance of 1-2 micrometers from an edge of the orthographic projection of the first light transmitting pattern.

5. The system according to claim 4, wherein the second exposure device comprises an air flotation device, configured to support the substrate during the second exposure process.

6. A black matrix, wherein the black matrix is prepared by the preparation method of a black matrix, comprising:
   forming a black matrix thin film on a substrate:
   performing a first exposure process on a side of the black matrix thin film away from the substrate by using a first mask plate;
   performing a second exposure process on a side of the black matrix thin film close to the substrate by using a second mask plate, and
   performing a development process on the black matrix thin film subjected to the first exposure process and the second exposure process to form the black matrix, wherein the first mask plate is provided with a first light transmitting pattern;
   the second mask plate is provided with a second light transmitting pattern; and
   an orthographic projection of the second light transmitting pattern on the substrate upon performing the second exposure process is located within an orthographic projection of the first light transmitting Pattern on the substrate upon performing the first exposure process, wherein
   an area of a surface of the black matrix dose to the substrate is not less than 50% of an area of a surface of the black matrix away from the substrate.

7. A display substrate, comprising the black matrix according to claim 6.

8. A display device comprising the display substrate according to claim 7.

* * * * *